US007266760B1

(12) United States Patent
Bain

(10) Patent No.: US 7,266,760 B1
(45) Date of Patent: Sep. 4, 2007

(54) METHOD AND APPARATUS FOR CALCULATING CYCLIC REDUNDANCY CHECKS FOR VARIABLE LENGTH PACKETS

(75) Inventor: Peter Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 522 days.

(21) Appl. No.: 10/956,974

(22) Filed: Sep. 30, 2004

(51) Int. Cl.
*H03M 13/09* (2006.01)
(52) U.S. Cl. .................................................. 714/807
(58) Field of Classification Search ................ 714/757, 714/758, 805
See application file for complete search history.

(56) References Cited

U.S. PATENT DOCUMENTS

| | | | | | |
|---|---|---|---|---|---|
| 5,390,196 | A | * | 2/1995 | Cecil et al. | 714/781 |
| 5,619,516 | A | * | 4/1997 | Li et al. | 714/807 |
| 5,671,238 | A | * | 9/1997 | Chen et al. | 714/757 |
| 5,694,407 | A | * | 12/1997 | Glaise | 714/807 |
| 5,844,923 | A | * | 12/1998 | Condon | 714/798 |
| 5,878,057 | A | * | 3/1999 | Maa | 714/757 |
| 5,953,240 | A | * | 9/1999 | Prabhu et al. | 708/530 |
| 6,014,767 | A | * | 1/2000 | Glaise | 714/776 |
| 6,128,766 | A | * | 10/2000 | Fahmi et al. | 714/807 |
| 6,189,124 | B1 | * | 2/2001 | Glaise | 714/758 |
| 6,192,491 | B1 | * | 2/2001 | Cashman et al. | 714/52 |
| 6,195,780 | B1 | * | 2/2001 | Dravida et al. | 714/758 |
| 6,223,320 | B1 | * | 4/2001 | Dubey et al. | 714/757 |
| 6,295,626 | B1 | * | 9/2001 | Nair et al. | 714/807 |
| 6,324,670 | B1 | * | 11/2001 | Henriksen | 714/807 |
| 6,519,737 | B1 | * | 2/2003 | Derby | 714/781 |
| 6,530,057 | B1 | * | 3/2003 | Kimmitt | 714/758 |
| 6,560,742 | B1 | * | 5/2003 | Dubey et al. | 714/757 |
| 6,701,478 | B1 | * | 3/2004 | Yang et al. | 714/757 |
| 6,701,479 | B2 | * | 3/2004 | Keller | 714/757 |
| 6,725,415 | B2 | * | 4/2004 | Ishiwaki | 714/781 |
| 6,795,946 | B1 | * | 9/2004 | Drummond-Murray et al. | 714/758 |
| 6,810,501 | B1 | * | 10/2004 | Ferguson et al. | 714/781 |
| 6,910,172 | B2 | * | 6/2005 | Hara et al. | 714/757 |
| 6,934,902 | B2 | * | 8/2005 | Hara et al. | 714/757 |
| 6,938,197 | B2 | * | 8/2005 | Doubler et al. | 714/757 |
| 6,938,198 | B1 | * | 8/2005 | Purcell | 714/758 |
| 7,191,383 | B2 | * | 3/2007 | Lin et al. | 714/774 |
| 7,206,994 | B2 | * | 4/2007 | D'Arcy et al. | 714/807 |

OTHER PUBLICATIONS

Stephen B. Wicker, "Error Control Systems for Digital Communication and Storage", Prentice Hall, 1995, pp. 113-118.
Andrew S. Tanenbaum, "Computer Networks," Prentice Hall, 1981, pp. 128-132.

* cited by examiner

*Primary Examiner*—Stephen M. Baker
(74) *Attorney, Agent, or Firm*—G. Victor Treyz

(57) ABSTRACT

Cyclic redundancy checking operations may be performed on a message made up of full words and a partial word. An accumulator value for the cyclic redundancy checking operations may be updated as the full words and partial word are processed. The partial word may be padded with pad bits. The effects of the partial word padding can be removed by performing polynomial division on the accumulator. Polynomial division may be performed using an arrangement where each polynomial division involves half as many bits as its predecessor. Iterative division schemes in which a fixed number of bits are processed in multiple passes may also be used. Hybrid arrangements involving cascaded divisions of different orders and iterative fixed-size division can be used. Unpadded partial words may also be processed using cascaded, iterative, and hybrid schemes.

20 Claims, 12 Drawing Sheets

METHOD AND APPARATUS FOR CALCULATING CYCLIC REDUNDANCY CHECKS FOR VARIABLE LENGTH PACKETS

BACKGROUND OF THE INVENTION

This invention relates to error checking, and more particularly, to ways in which to perform cyclic redundancy checking on data packets of variable lengths.

Error-detecting code techniques such as cyclic redundancy checking (CRC) techniques are commonly used in data communications and other applications in which it is desired to check whether data has been corrupted. In a typical scenario, data to be transmitted (called a "message") is encoded by performing CRC operations. During CRC operations, message bits are processed to generate corresponding parity bits (also sometimes called a CRC checksum). The parity bits are appended to the message bits to form code words.

Each codeword is transmitted over the communications link and is received by appropriate receiver circuitry at a remote circuit. The receiver circuitry performs the same type of CRC calculations on the codewords that were performed at the receiver. The resulting calculations are then evaluated to determine whether the transmitted data has been corrupted. With one approach, the parity bits from the receiver are compared to newly calculated parity bits to determine whether they match as expected. If the CRC operations performed at the receiver reveal that the computed parity bits do not match the parity bits that were transmitted as part of the codeword, then appropriate actions can be taken. For example, the receiver can ask the transmitter to resend the data.

Sometimes CRC functionality is used locally. For example, CRC techniques may be used to check whether data has been corrupted on a local hard disk drive. With this type of arrangement, CRC operations are performed before data is stored in the drive and when the stored data is being retrieved.

To calculate the parity bits for a message, the message bits are treated as the coefficients of a polynomial. During CRC processing, the polynomial is divided by another polynomial called the generator (g) using polynomial division. The remainder of this polynomial division becomes the parity bits.

In low data-rate environments, it is possible to compute parity bits on incoming message bits by processing each bit one at a time. A running value (the accumulator "A") is computed as each bit is received. After the last message bit has been processed, the value of the accumulator A is equal to the desired remainder (i.e., the desired parity bits).

At higher data rates, it is desirable to handle message bits in batches (bytes), typically of 8 bits. With this type of scheme, the message bits are processed 8 bits at a time. Each 8 bits that are processed result in an update to the value of the accumulator A. When an entire packet of message bits (i.e., an entire message) has been processed, the value of the accumulator represents the parity bits for the message. Because packets of message bits typically have bit lengths that are integral multiples of 8, this type of scheme is generally satisfactory, so long as the data rate is not too high.

At even higher data rates, further increases in CRC throughput are needed. As a results, CRC arrangements have been developed that handle data in larger batches. For example, CRC arrangements have been developed that handle message data in 64-bit (8-byte) batches. When messages have lengths that are multiples of 8 bytes, a single CRC circuit can be used to handle the functions associated with calculating the accumulator A. For example, if a message is 128 bits long, this CRC circuit could make two calculations—one to calculate an initial value of A based on the first 8 bytes and one to calculate the final value of A based on the initial value of A and the next 8 bytes. A message that is 256 bits long could be treated similarly using the CRC circuit to calculate the initial value of A and then updating this value three times using the same CRC circuit.

As the size of the "batch" in which the message bits increases, however, it becomes increasingly less realistic to expect all message to have a length that is an integral multiple of the batch size. Thus it is generally not practical or desirable to require that all messages have a length that is an exact multiple of 64 bits (i.e., only full 64-bit words). This has resulted in the use of special length-dependent CRC circuits, each of which is designed to handle the CRC operations associated with a particular length of data.

In a situation in which CRC operations are performed on eight bytes of the message at a time, it is typically necessary for CRC processing circuitry to include 8 special length-dependent CRC circuits for calculating the accumulator. Each of these eight length-dependent CRC circuits handles a different one of the eight possible message-length scenarios. If the length of the message is an integral number of 64-bit words, a first CRC circuit is used to update the accumulator as the message is processed. If, however, the length of the message is not an integral number of 64-bit words and the end of the message contains a partial word, the message bits in the partial word can be handled by an appropriate one of the remaining CRC circuits. For example, if a partial word at the end of the message contains three bytes of data, a special three-byte CRC circuit may be used to perform the final accumulator update. A partial word can contain anywhere from one byte to seven bytes of data, so seven of the eight length-dependent CRC circuits are used to handle accumulator updating operations in each of these seven conditions.

With this type of parallel CRC arrangement the number of CRC subcircuits that are required to perform CRC operations scales linearly with the number of possible partial word lengths, resulting in the consumption of significant resources.

It would be desirable to be able to handle messages containing partial words more efficiently.

SUMMARY OF THE INVENTION

In accordance with the present invention, methods and apparatus are provided for performing cyclic redundancy checking operations. Packets of data to be processed are called messages. Each message includes a number of full words and may conclude with a partial word. The partial word may be processed by padding the partial word with a sufficient number of "0" bits or another suitable pattern of pad bits to make up a full word. The full word that has been constructed from the padded partial word can then be processed like a full word.

To remove the effects of padding, polynomial division is performed. During the division operations, a particular form of division modulo g is performed (where g is a generator polynomial). In particular, when dividing A by x, the quantity (A/x) mod g is calculated by checking the coefficient of the $x^0$ term of A (conventionally bit 0), and, if it is 1, adding g to A (using an exclusive-OR operation) and dividing the result by x (i.e., shifting bit 0 out), otherwise, simply dividing A by x. A/x$^n$ can be implemented by performing this operation recursively.

During polynomial division, a series of cascaded divisions may be performed to complete the necessary division operations. The amount of polynomial division to be performed depends on the amount of padding that was used. If, for example, 24 pad bits were added to the partial word, polynomial division by a polynomial of order 24 is required. To accommodate a wide range of pad bit configurations without using an excessive amount of division resources, the cascaded divisions can be staggered so that at first w/2 bits are divided, then w/4, and so forth, where w is the number of bits in a full word. This type of approach consumes resources (circuits and/or software) in a way that scales logarithmically with the number of bits to be processed, rather than linearly.

If desired, iterative division schemes may be used in which a fixed number of bits are processed per pass and in which multiple passes are used to complete the desired amount of division. In hybrid schemes, both cascaded divisions and iterative divisions are performed.

Messages with partial words can be processed efficiently without padding by using cascaded partial cyclic redundancy checking stages. Each cascaded stage can process half as many bits as its predecessor, so that the number of stages that are required scales logarithmically rather than linearly with partial word length. Iterative approaches may also be used in which multiple passes are made, each of which processes a fixed number of bits in the partial word. If desired, cascaded and iterative schemes for handling unpadded partial words may be used together in a hybrid arrangement.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to ways in which to perform cyclic redundancy check (CRC) operations. The functionality for implementing the CRC operations of the present invention may be implemented using hardware (circuitry) and/or software (e.g., code in a microprocessor, configuration data in a programmable logic device, instructions in a digital signal processor, etc.) As an example, the polynomial divisions, multiplications, and additions involved in performing CRC operations may be performed using software and/or using dedicated circuits that perform these functions. The present invention therefore relates to both software and hardware implementations. A CRC circuit may be formed from hardwired logic or from programmable logic (e.g., logic on a programmable logic device that has been configured to perform the functions of the CRC circuit using configuration data).

The present invention may sometimes be described below in the context of arrangements using particular byte and word sizes. This is merely illustrative. Any suitable byte and word sizes may be used if desired.

CRC operations may be used to encode data. A data packet that is encoded during such operations is generally referred to as a "message" or "message bits." The CRC operations performed on the message bits produce corresponding parity bits (sometimes referred to as a CRC checksum or CRC of the message). The message bits and corresponding parity bits are combined to produce codewords. In a typical scenario, the codewords are transmitted to a remote receiver where they are decoded using CRC operations of the same type used during encoding operations. In particular, the CRC decoder at the receiver may compute a new set of parity bits from the codeword. By comparing the newly-calculated value of the parity bits to the value of the parity bits that was transmitted with the codeword, the receiving circuitry can determine whether the data has been corrupted.

The present invention is generally described in the context of using CRC operations to CRC-encode and error check data to be transmitted over a communications link. The link may be, for example, a high-speed communications link between two boards in a system rack. This is, however, merely one illustrative arrangement. For example, CRC operations may be performed prior to storing data on a hard drive. When the data is retrieved, the parity bits can be compared against newly-calculated parity bits to determine whether the data was corrupted during storage. If desired, the CRC functionality of the invention may be used in other contexts as well.

Figure 1:
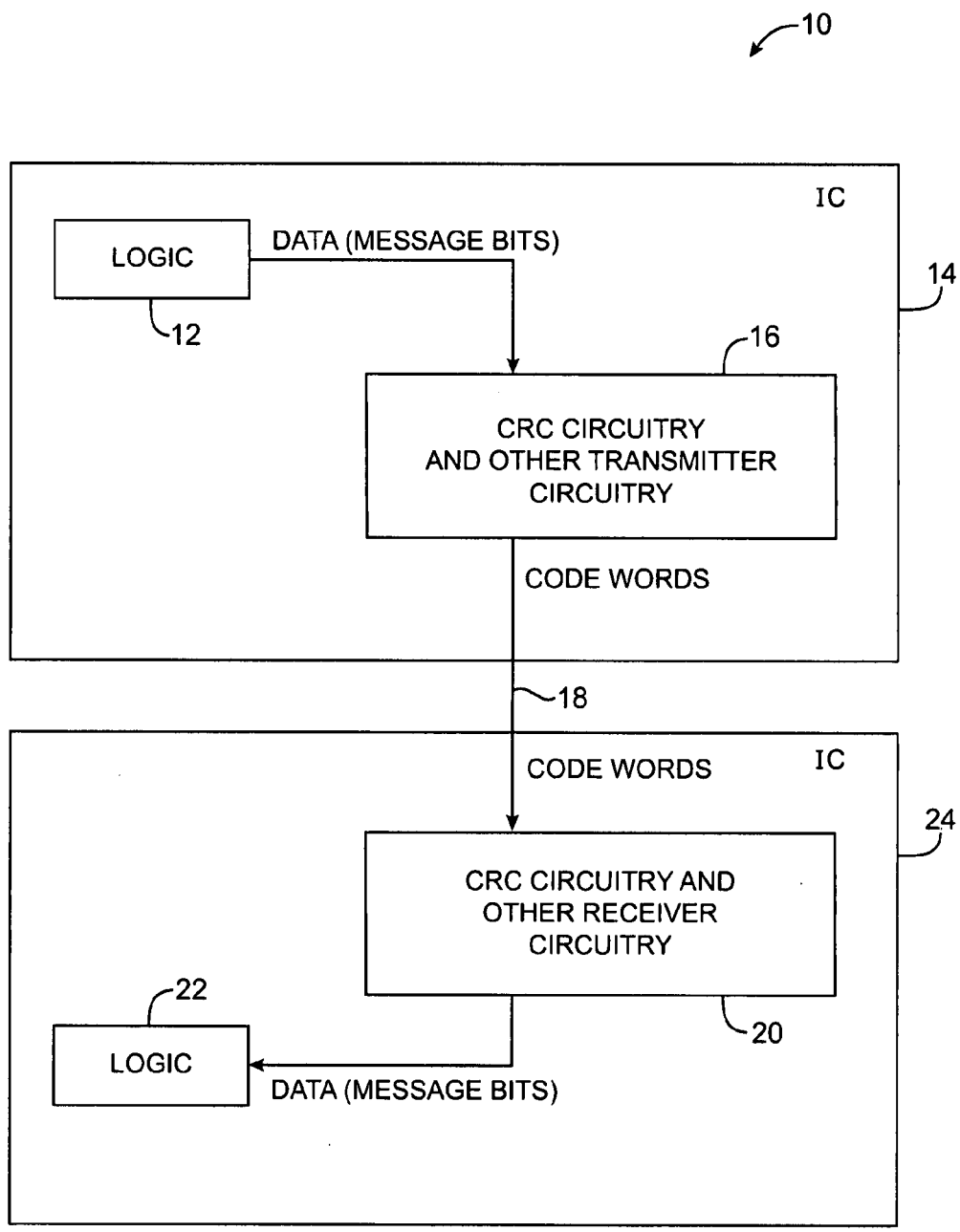
FIG. 1 is schematic diagram of an illustrative system for performing CRC operations in accordance with the present invention.

A typical system environment in which CRC operations may be performed before and after transmission of data over a communications link is shown in FIG. 1. In the example of FIG. 1, data is produced by logic 12 on integrated circuit 14. Logic 12 may be digital logic circuitry such as hardwired or programmable logic circuitry. Integrated circuits such as circuits 14 and 24 in system 10 may be any suitable integrated circuit such as communications chips, microprocessors, programmable logic devices, application-specific integrated circuits with communications capabilities, etc. CRC and other transmitter circuitry 16 is used to process the outgoing data from logic 12 prior to transmission of the data to integrated circuit 24 over communications path 18.

The data packets produced by logic 12 may be referred to as messages. Circuitry 16 processes the message bits from logic 12 using CRC functions to produce parity bits. Circuitry 16 may also perform other functions (e.g., insertion of idle codes, clock compensation characters, packet information, etc.).

Circuitry 16 may combine the message bits and CRC parity bits to form codewords. With one suitable arrangement, the message bits are padded with zeros or another known pattern of pad bits and the parity bits are appended to the padded message to form the codewords. A relatively small number of CRC polynomial division circuits (or look-up tables in software implementations) may be used during computation of the parity bits from the padded message. With one suitable approach, the number of CRC circuits that is used to handle partial words scales logarithmically with the number of possible partial word sizes. With another suitable approach, a single CRC dividing circuit may be used repeatedly, in an iterative fashion. If desired, hybrid arrangements may be used that include one or more cascaded conditional division circuits for handling certain partial word sizes in conjunction with recursive dividing circuit arrangements.

At circuit 24, CRC circuitry and other receiver circuitry 20 receives the codewords from path 18. The CRC circuitry 20 may compute the parity bits corresponding to the messages. The parity bit portion of each codeword can then be compared to each newly-generated version of these parity bits. If there is match, it can be concluded that the message was not corrupted, and logic 22 can use the received data. If there is not a match, the data has been corrupted. If desired, error checking can be performed by calculating the parity bits from the codeword (i.e., both the message bits and the original parity bits) and checking whether these parity bits are zero (or another known value). The receiver circuitry 20 or other suitable circuitry on integrated circuit 24 may take appropriate action when an error is detected such as requesting that the transmitter resend the data, etc. (Resend requests and other data may be sent from integrated circuit 24 using transmitter circuitry and may be received by integrated circuit 14 using receiver circuitry.)

Figure 2:
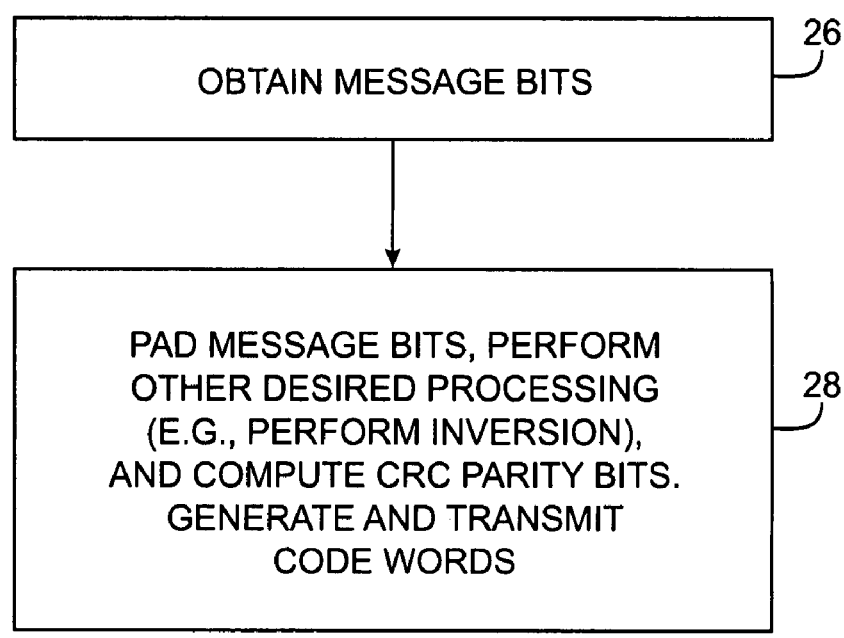
FIG. 2 is a flow chart of illustrative steps involved in performing CRC operations to generate codewords for transmission in accordance with the present invention.
Figure 3:
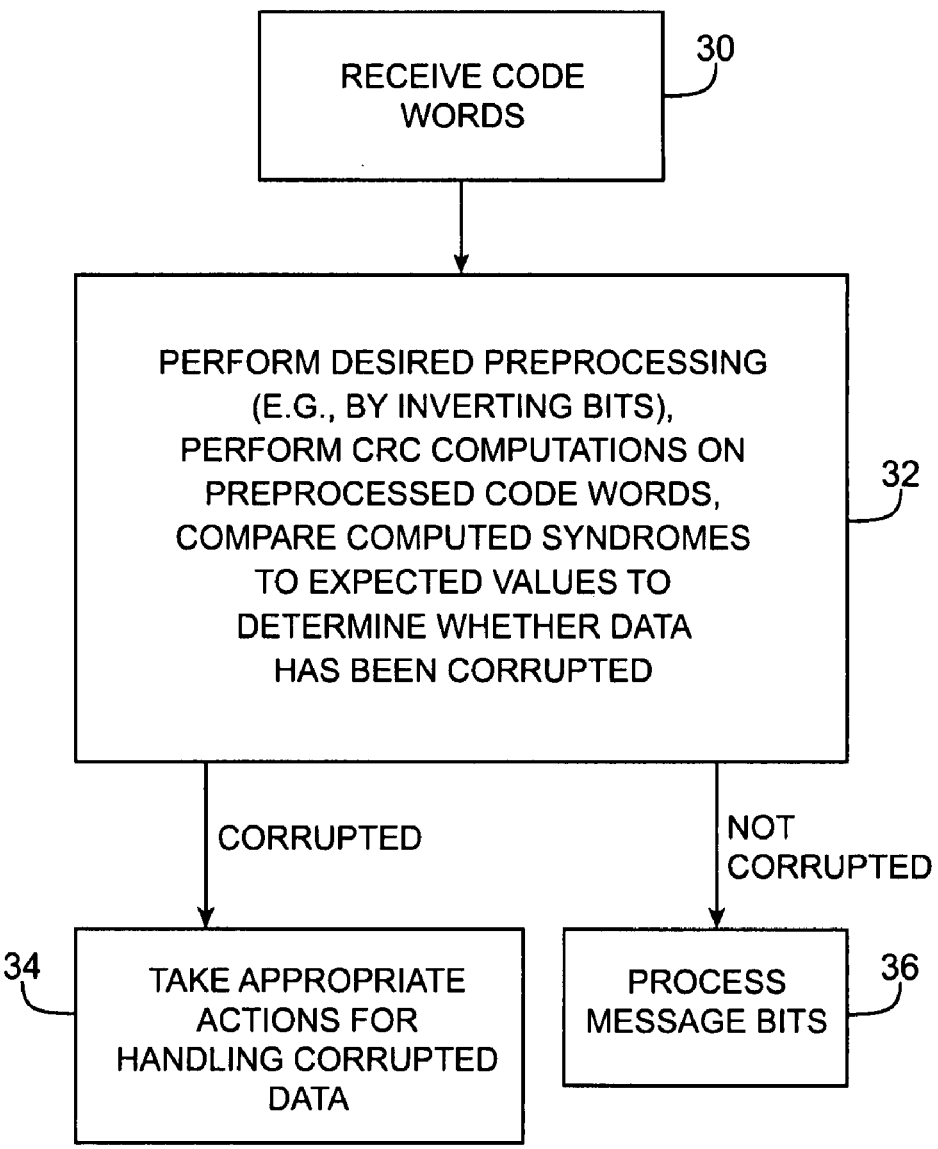
FIG. 3 is a flow chart of illustrative steps involved in receiving data and performing CRC operations to check for data corruption in accordance with the present invention.

Illustrative steps involved in performing CRC operations using the equipment of system 10 are shown in FIGS. 2 and 3.

As shown in FIG. 2, at step 26, circuitry 16 may obtain message bits to be transmitted from logic 12. If the message bits contain an integral number of complete words (e.g., an integral number of 64-bit words), the CRC parity bits may be computed at step 28 using the message bits. If the last word in the message is a partial word, the circuitry 16 may add pad bits (e.g., logic "0s" or other suitable bits in a known pattern) to the message to fill up the empty bit positions in the partial word.

If desired, other processing may also be performed during step 28 before the CRC is computed. For example, the circuitry 16 may invert some of the data after the initial message bits. Inverting the data in this way helps to avoid confusion by making it possible to discriminate between a faulty transmitter and the intentional transmission of a large number of logic "0s." With one suitable approach, the first k-n bits may be inverted where n is the length of the codewords and k is the number of message bits in the message (i.e., where k-n is the length of the CRC). The k-n message bits need only be inverted for purposes of performing the CRC computation of the parity bits. The message bits being transmitted over link 18 need not be inverted. Codewords are formed by adding the parity bits that have been computed to the end of each message. The codewords may then be transmitted to the receiver.

As shown in FIG. 3, the receiver circuitry 20 may receive the transmitted codewords at step 30. Each codeword contains message bits for a message and the parity bits that were calculated for that message at the transmitter. At step 32, the CRC circuitry at the receiving integrated circuit may be used to perform desired preprocessing operations on the codewords (e.g., to invert certain message bits if this process was used at the transmitter and to pad the codeword with the 0s or other pad bits used at the transmitter). The CRC circuitry 20 may then may then be used to perform polynomial division on the padded codeword. The remainder of this division, which is sometimes referred to as the "syndrome" is compared to a known expected syndrome (e.g., an expected syndrome might be "0"). If the computed syndrome matches the expected syndrome, the message bits can be processed by logic 22 as normal, uncorrupted data (step 36). If the computed syndrome is not as expected, the data can be treated as being corrupted. For example, at step 34, the transmitting circuit may be requested to retransmit the corrupted data.

Figure 4:
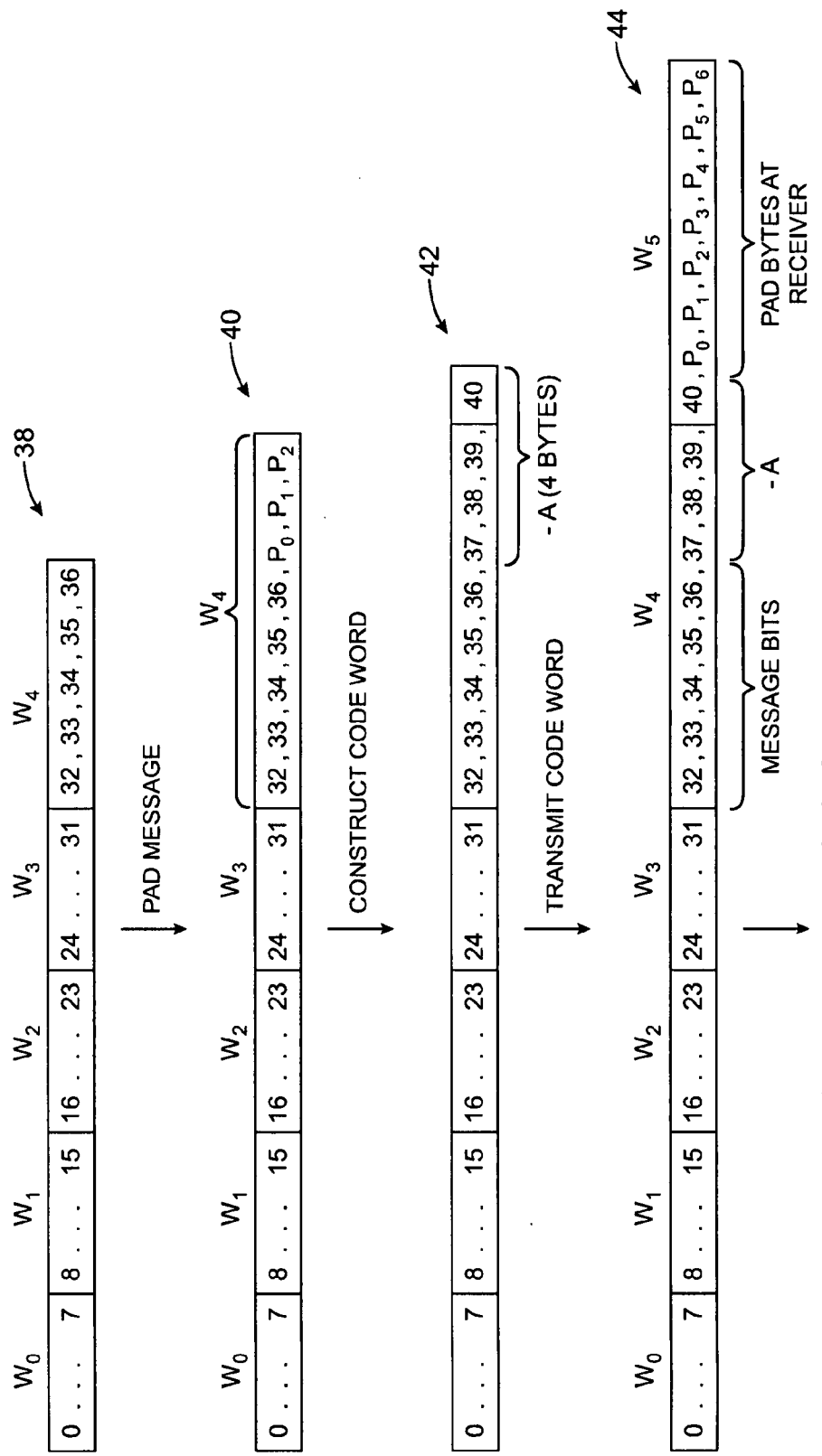
FIG. 4 is a diagram showing how data may be processed during CRC operations in accordance with the present invention.

FIG. 4 is a diagram that shows the evolution of illustrative data during coding and decoding procedures in accordance with the present invention. In this example, the byte size b is 8 bits, the word length w is 64. Accordingly, the size of each batch of bits being processed during CRC operations is 64 bits (8 bytes). The strength of the CRC algorithm being used is 32 bits. These parameters are merely illustrative and are used to allow presentation of an example. In general, any suitable values may be used for the byte size, word length, and CRC strength. Packet sizes (the number of message bits to be processed) may vary.

In the example of FIG. 4, the initial unprocessed packet size (i.e., the size of the message) is 37 bytes. Initially, as shown in the upper row of FIG. 4, the message 38 (e.g., the message bits from logic 12 of FIG. 1) has 37 unprocessed message bytes 0 through 36. Because the word size is 8 bytes, the message has four full 8-byte words ($w_0$, $w_1$, $w_2$, and $w_3$) and one partial 5-byte word ($w_4$).

Circuitry 16 (FIG. 1) pads the message 38 to produce padded message 40. In padded message 40, pad bytes $P_0$, $P_1$, and $P_2$ have been added to word $w_4$. This converts the partial word $w_4$ of message 38 into the full (padded) word $w_4$ of padded message 40. Any suitable padding scheme may be used. For example, pad bytes containing only logic "0s" may be appended to the message. There are three pad bytes in this example, so the parameter p, which represents the number of pad bits being added is equal to 24 (in this example).

After the message has been padded, CRC operations may be performed. During these operations, the effect of the pad bits can be removed by dividing by $x^p$ (i.e., $x^{24}$ in this example) using polynomial division.

The parity bit calculations on the padded message may be performed using a fixed (but reduced) number of cascaded dedicated CRC divider circuits (or, in software, look-up tables), by using a single divider circuit (or look-up table) that is used in multiple passes in an iterative fashion, or using a hybrid approach that uses both cascaded CRC division and an iterative arrangement.

During CRC operations, parity bits are calculated by updating a value of a CRC accumulator A. When the update to A that is based on the final word ($w_4$ in this example) has been computed, the calculation of A is complete, and an inverted version of that value of A may be appended to the message to form the codeword, as shown by the illustrative codeword 42 in FIG. 4.

After the codeword has been transmitted to the receiver and received, the receiver may process the codeword to calculate a syndrome (using the same types of processing and polynomial operations that were used at the transmitter). The syndrome is then compared to a known (precalculated) syndrome to determine whether there is a match. If the newly calculated syndrome matches the known syndrome, the receiver can conclude that the data has not be corrupted during transmission.

During CRC operations at the receiver, the same padding technique that was used at the transmitter may be used to convert any trailing partial word to a complete word. In the example of FIG. 4, after the parity bits were appended to the message to construct codeword 42, the codeword contained a partial word with one byte (byte 40). Upon receipt of this codeword at the receiver, the receiver therefore pads the received codeword with 7 pad bytes ($P_0$, $P_1$, $P_2$, $P_3$, $P_4$, $P_5$, and $P_6$) to produce padded codeword 44. CRC operations are then performed on the padded codeword 44 to determine whether the message has been corrupted.

Figure 5:
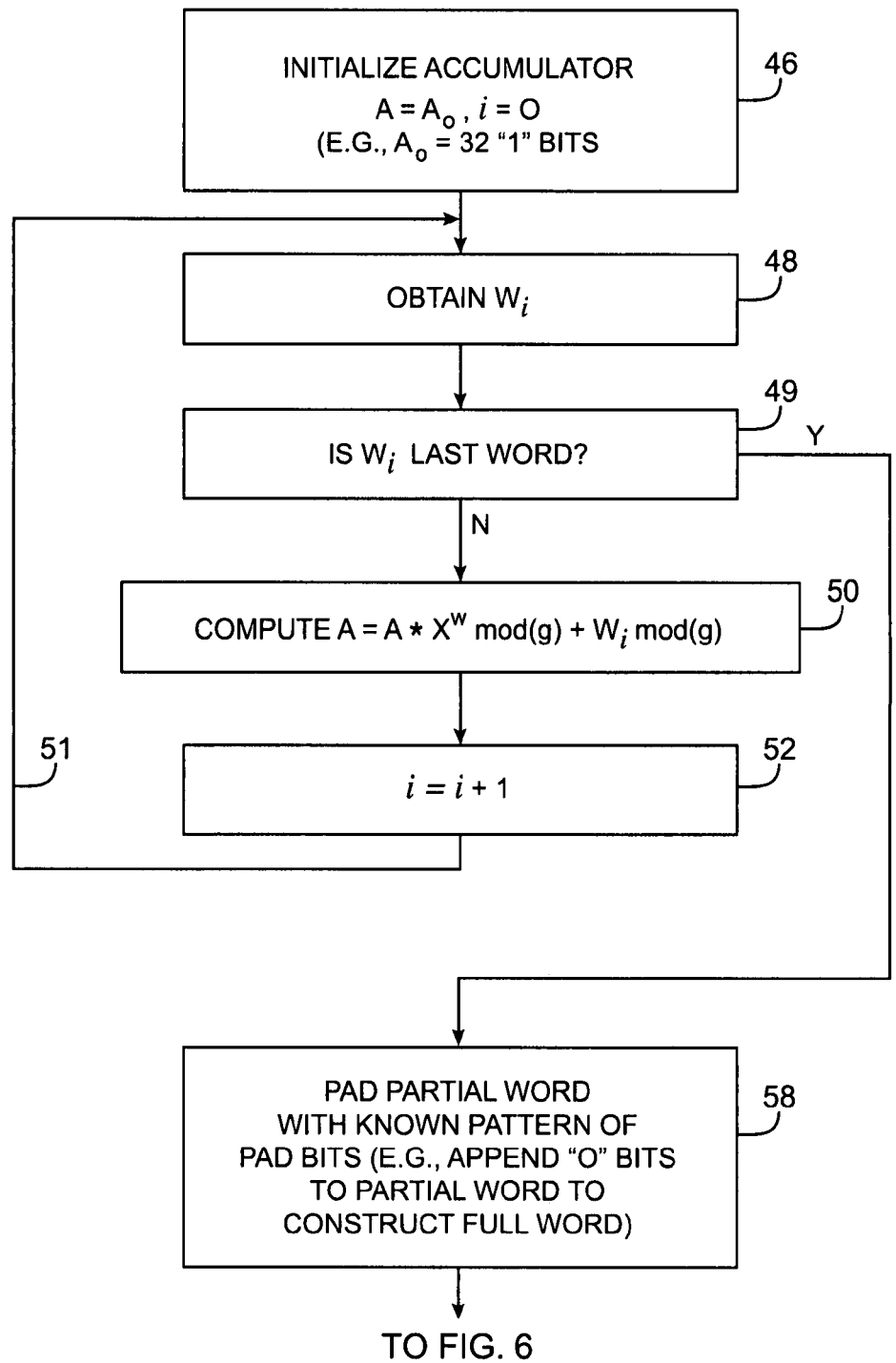
FIGS. 5 and 6 contain a flow chart of illustrative steps involved in using data padding and a cascaded division arrangement to process data to produce codewords in accordance with the present invention.
Figure 6:
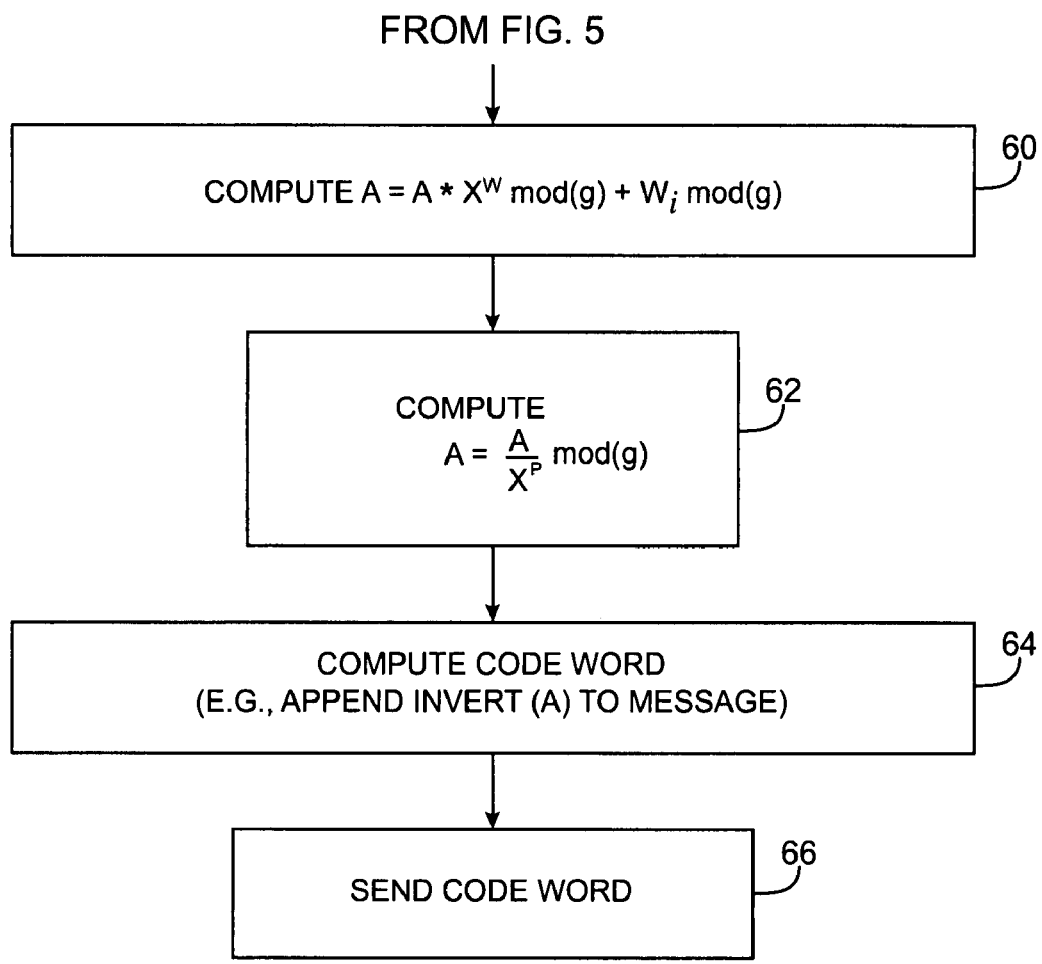

A flow chart of illustrative steps involved in performing CRC operations at the transmitter using a partial-word padding scheme in accordance with the present invention is shown in FIGS. 5 and 6. In this example, the illustrative parameters remain the same as those discussed in connection with the example of FIG. 4—byte size b=8 and word length w=64.

At step 46, preparations are made for processing the message by initializing the value of the accumulator A. The value of the accumulator A may, for example be set to "1" for all of its bits (all 32 bits in this example). A counter i may be set to 0.

At step 48, the CRC circuitry at the transmitter obtains the word $w_i$.

At step 49, the circuitry 16 (FIG. 1) determines whether the word obtained at step 48 was the last word of the message.

If $w_i$ is not the last word, at step 50, the accumulator is updated using equation 1.

$$A=A*x^w \bmod(g)+w_i \bmod(g) \qquad (1)$$

In equation 1, g is the generator polynomial, "*" denotes polynomial multiplication (i.e., appending "0s" in this example), and "+" denotes polynomial addition (i.e., addition mod (2)).

At step 52, the counter i is incremented and control loops back to step 48, as indicated by line 51.

If it was determined at step 49 that $w_i$ is the last word, the process continues at step 58. If the word obtained at step 48 was a partial word, padding operations are performed at step 58. During step 58, the partial trailing word of the message is converted into a full, padded word to facilitate subsequent processing.

At step 60 (FIG. 6), the accumulator is updated using equation 1.

At step 62, the effect of the pad bits is removed from the accumulator using equation 2, where p is the number of pad bits.

$$A=[A/x^p] \bmod(g) \qquad (2)$$

At step 64, the codeword is computed by adding the value of A to the message (e.g., by appending −A to the message).

The codeword that is constructed at step 64 may be sent to the receiver circuitry 20 (FIG. 1) at step 66.

Figure 7:
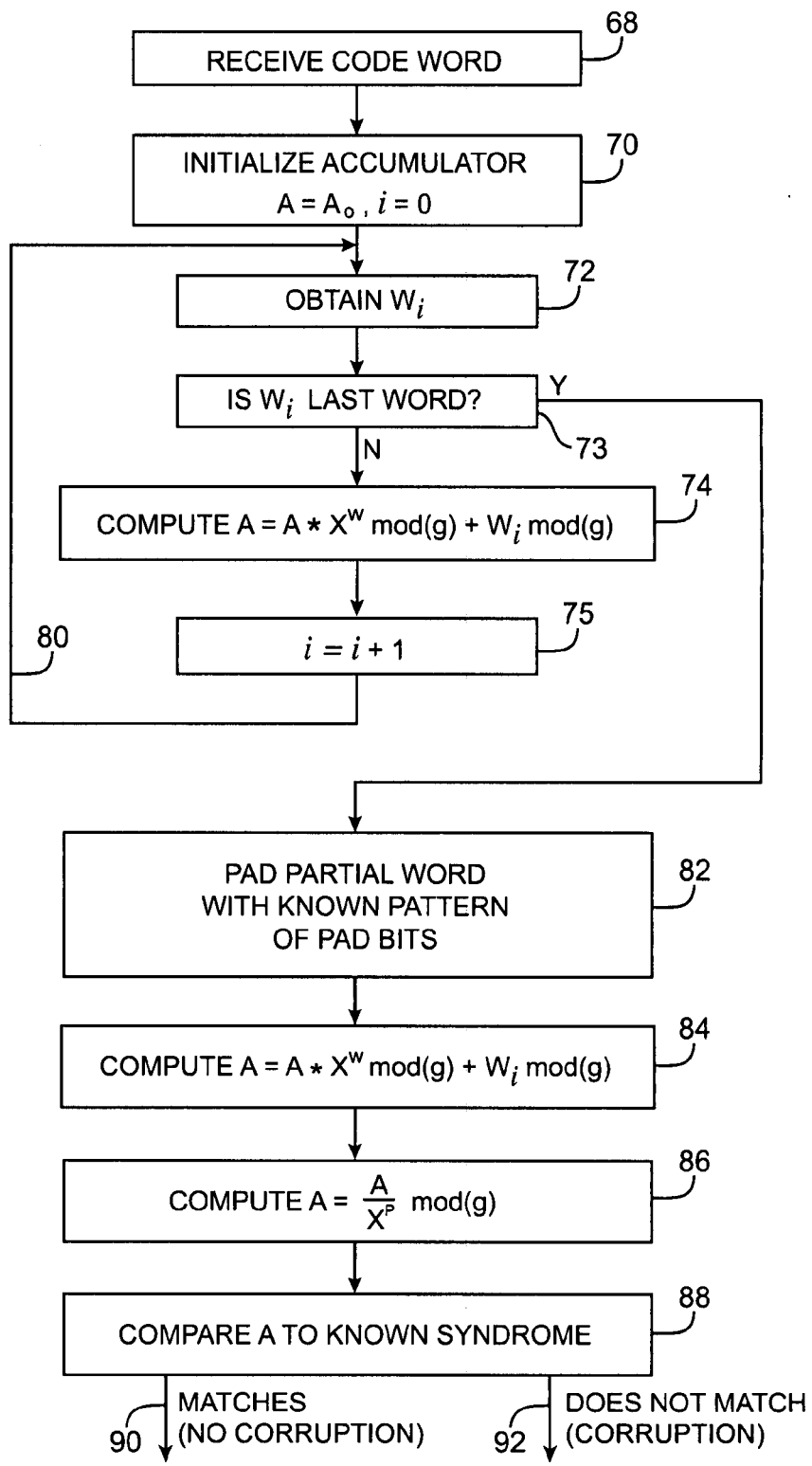
FIG. 7 is a flow chart of illustrative steps involved in using data padding and a cascaded division arrangement to process received data to check for data corruption in accordance with the present invention.

Illustrative steps involved in using the receiver circuitry 20 to receive and evaluate the transmitted codeword for possible data corruption are shown in FIG. 7.

At step 68, the codeword is received from the transmitter.

At step 70, the accumulator A and counter i are initialized.

At step 72, the CRC circuitry at the receiver obtains the word $w_i$ from the received codeword.

At step 73, circuitry 20 performs a test to determine whether the word $w_i$ that has been obtained is the last word.

If $w_i$ is not the last word, the accumulator is updated using equation 1 at step 74.

At step 75, the counter is incremented by one.

The process then loops back to step 72, as indicated by line 80.

If at step 73 it was determined that the word obtained at step 72 was the last word, padding operations are performed at step 82 if the last word is partial. During step 82, the partial trailing word of the message is converted into a full, padded word to facilitate subsequent processing.

At step 84, the accumulator is updated using equation 1.

At step 86, the effect of the pad bits is removed from the accumulator using equation 2, where p is the number of pad bits. The value of A computed during step 86 may be referred to as the syndrome.

At step 88, the value of A (the computed syndrome of step 86) may be compared to a precalculated (expected) syndrome value. If there is a match, circuitry on the receiving integrated circuit 24 (e.g., logic 22) can use the received message bits as regular, uncorrupted data (see line 90). If there is not a match, the receiving integrated circuit can take actions suitable when there is data corruption (line 92). For example, the receiving integrated circuit may ask the transmitting integrated circuit to resend the message.

Both the transmitter circuitry 16 and receiver circuitry 20 remove the effects of the pad bits by performing polynomial division (step 62 of FIG. 6 and step 86 of FIG. 7). The number of pad bits that are removed during these operations is given by a parameter p. In the example discussed in connection with FIGS. 4-7, three pad bytes $P_0$, $P_1$, and $P_2$ were added at step 58, so at step 62, 24 pad bits are divided out of the accumulator A—i.e., p=24 in equation (2). The number of pad bytes that were added at step 82 (FIG. 7) was larger—i.e., 7 pad bytes $P_0$, $P_1$, $P_2$, $P_2$, $P_4$, $P_5$, and $P_6$ were added, because at step 82 the partial word to be padded only contained a single byte. As a result, the number of bits removed at step 86 of FIG. 7 is p=56.

Figure 8:
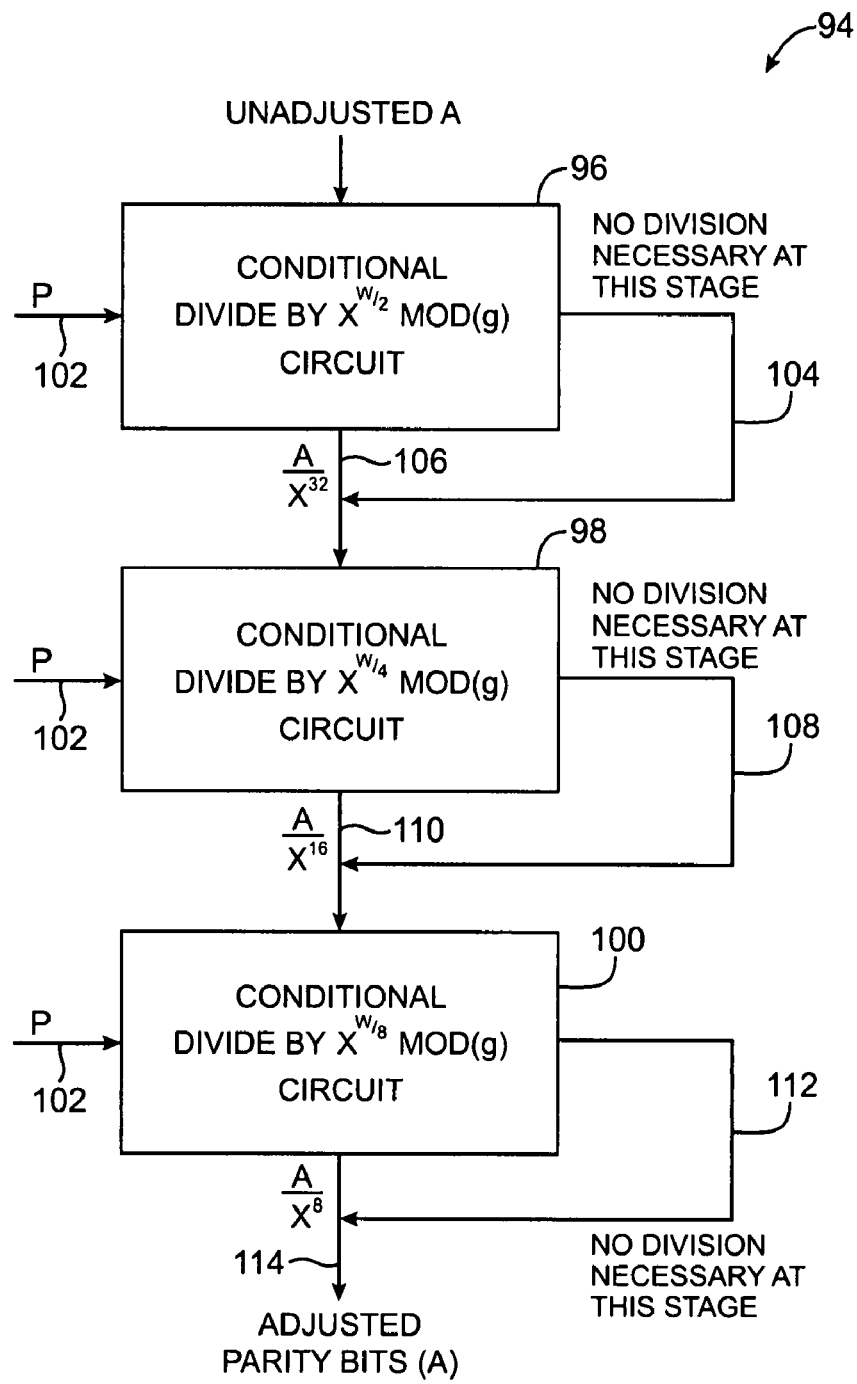
FIG. 8 is a diagram of illustrative CRC circuitry having a logarithmic number of cascaded conditional dividing circuits of various orders (strengths) in accordance with the present invention.

Illustrative circuitry 94 that may be used in circuitry 16 and 20 to perform the polynomial division operations of steps 62 and 86 is shown in FIG. 8. The circuitry 94 contains multiple serially-connected conditional division circuits. In the example of FIG. 8, there are three cascaded conditional division circuits, which is suitable for handling the pad bit removal operations needed for the example discussed in connection with FIG. 4 (i.e., up to a maximum of 56 pad bits—7 pad bytes—may be removed). In general, the number of cascaded division circuits that are used depends on the number of potential pad bits to be removed. When larger word sizes are used, more cascaded division circuits are used. When smaller word sizes are used, fewer cascaded division circuits are needed. The number of bits processed by each cascaded circuit is half of the number of bits processed by its predecessor in the chain. The number of division circuits required for complete processing therefore scales logarithmically (base 2) with the number of pad bytes to be removed. To remove from 0-7 pad bytes, it is only necessary to use $\log_2(8)=3$ division circuits, as shown in FIG. 8. This arrangement (or its software counterpart implemented using look-up tables) therefore helps to conserve CRC resource consumption on the integrated circuits. The order of the conditional division circuits of FIG. 8 is not critical. Any order may be used if desired (e.g., $\div x^{w/2}$, $\div x^{w/8}$, $\div x^{w/4}$ or $\div x^{w/8}$, $\div x^{w/2}$, $\div x^{w/4}$, etc)

The cascaded division circuits 96, 98, and 100 of FIG. 8, receive a binary representation of the number of pad bytes P to be removed at inputs 102. Circuit 96 examines the appropriate bit position of P to determine whether division by $x^{w/2}$ (w/2=32 in this example) is required. If no division is required, the value of the accumulator A is passed to circuit 98 (represented schematically via path 104). If division is required, division is performed and the updated value of the accumulator is passed to circuit 98 via path 106. Similarly, circuit 98 decides whether or not to perform division on A and, depending on the result, passes an unchanged value of A to circuit 100 via path 108 or passes a value of A that has been divided by $x^{16}$ (w/4=16 in this example) to circuit 100 via path 110. Circuit 100 behaves similarly. If division is required, the appropriate division operation (in this example polynomial division by $x^{w/8}=x^8$) is performed and the correspondingly adjusted value of A is passed directly to output 114. If division by circuit 100 is not required, an unchanged value of A is passed to output 114 by path 112. The adjusted value of A produced at output 114 may be used as the parity bits to append to the message when constructing the codeword (step 64 of FIG. 6) or, when calculated by a receiver based on a codeword received from a transmitter, may be compared to the expected syndrome (step 88 of FIG. 7) to determine whether data has been corrupted.

When w=64 and b=8 as in the present example, P ranges from 0 to 7. As a result, circuit 96 removes 0 or 4 pad bytes, circuit 98 removes 0 or 2 pad bytes, and circuit 100 removes 0 or 1 pad byte. Only three division circuits (or their software counterparts) are needed to adjust the accumulator value A to accommodate the effects of the pad bytes.

Figure 9:
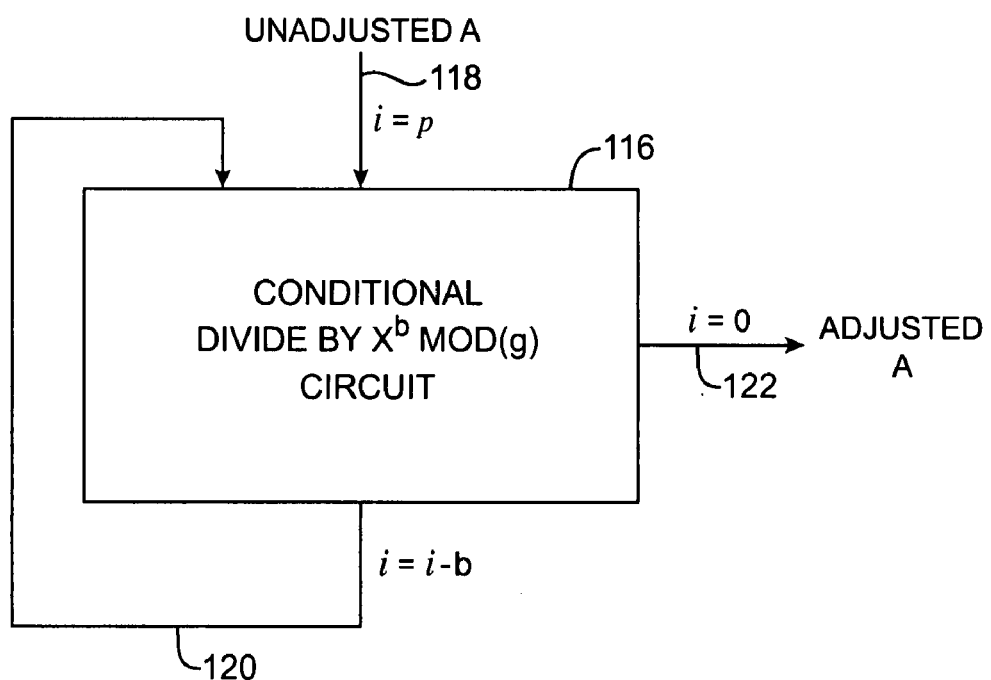
FIG. 9 is a diagram of illustrative CRC circuitry having a single dividing circuit through which multiple passes may be made iteratively to perform multiple division operations in accordance with the present invention.

An iterative division arrangement that may used to perform the operations of equation 2 is shown in FIG. 9. In the division circuitry arrangement of FIG. 9, the unadjusted value of A is provided to circuit 116 via input 118. A counter is initialized (i.e., i=p). As shown schematically by line 120, the circuit 116 can be used to repeatedly divide A by $x^b$ in an iterative fashion until all of the pad bits have been divided out of the accumulator. The correspondingly adjusted value of A is then provided at output 122. Because multiple passes are made through the divide by one-byte circuit 116, the total delay time associated with using the arrangement of FIG. 9 scales linearly with the number of bytes to be removed.

Figure 10:
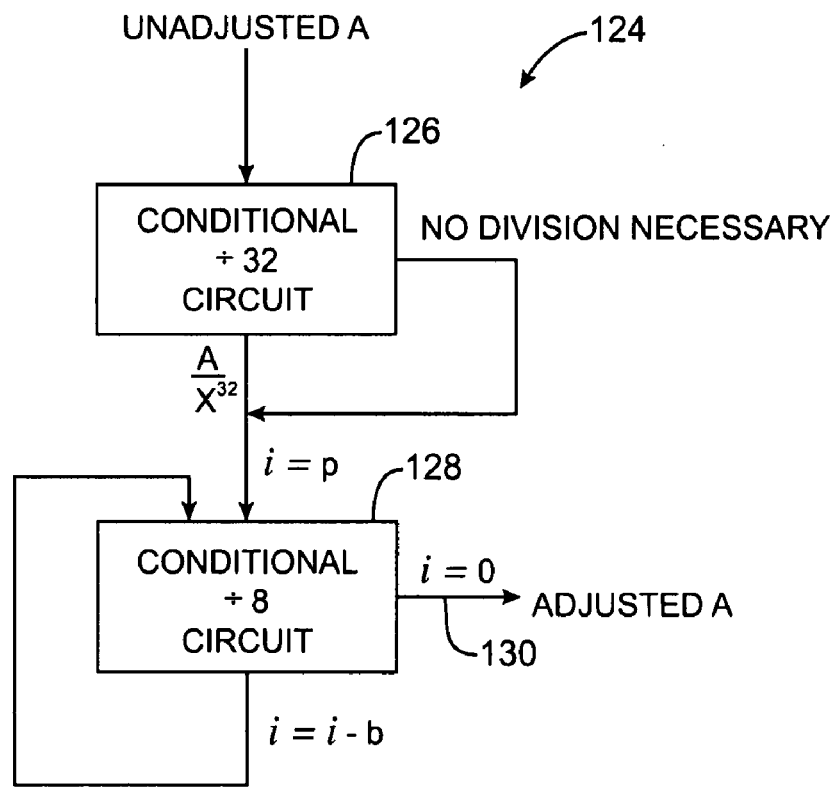
FIG. 10 is a diagram of illustrative hybrid CRC circuitry having both a conditional dividing circuit and a recursive dividing circuit through which multiple passes may be made to perform CRC division operations in accordance with the present invention.

If desired, a hybrid approach may be used to remove pad bytes, as shown in FIG. 10. With a hybrid approach, one or more cascaded division circuits of the type shown in FIG. 8 (each having a division order of half that of the previous circuit) may be used in conjunction with an iterative division circuit of the type shown in FIG. 9 (or their look-up table counterparts in a software implementation). In the example of FIG. 10, circuitry 124 has a conditional divide-by-32 circuit 126 that remove 0 or 4 bytes of pad bits from A. Circuit 128 is cascaded in series with circuit 126 and removes one byte of pad bits at a time. Multiple consecutive passes may be made through circuit 128, each of which removes one pad byte. The final adjusted value of A is provided at output 130.

Figure 11:
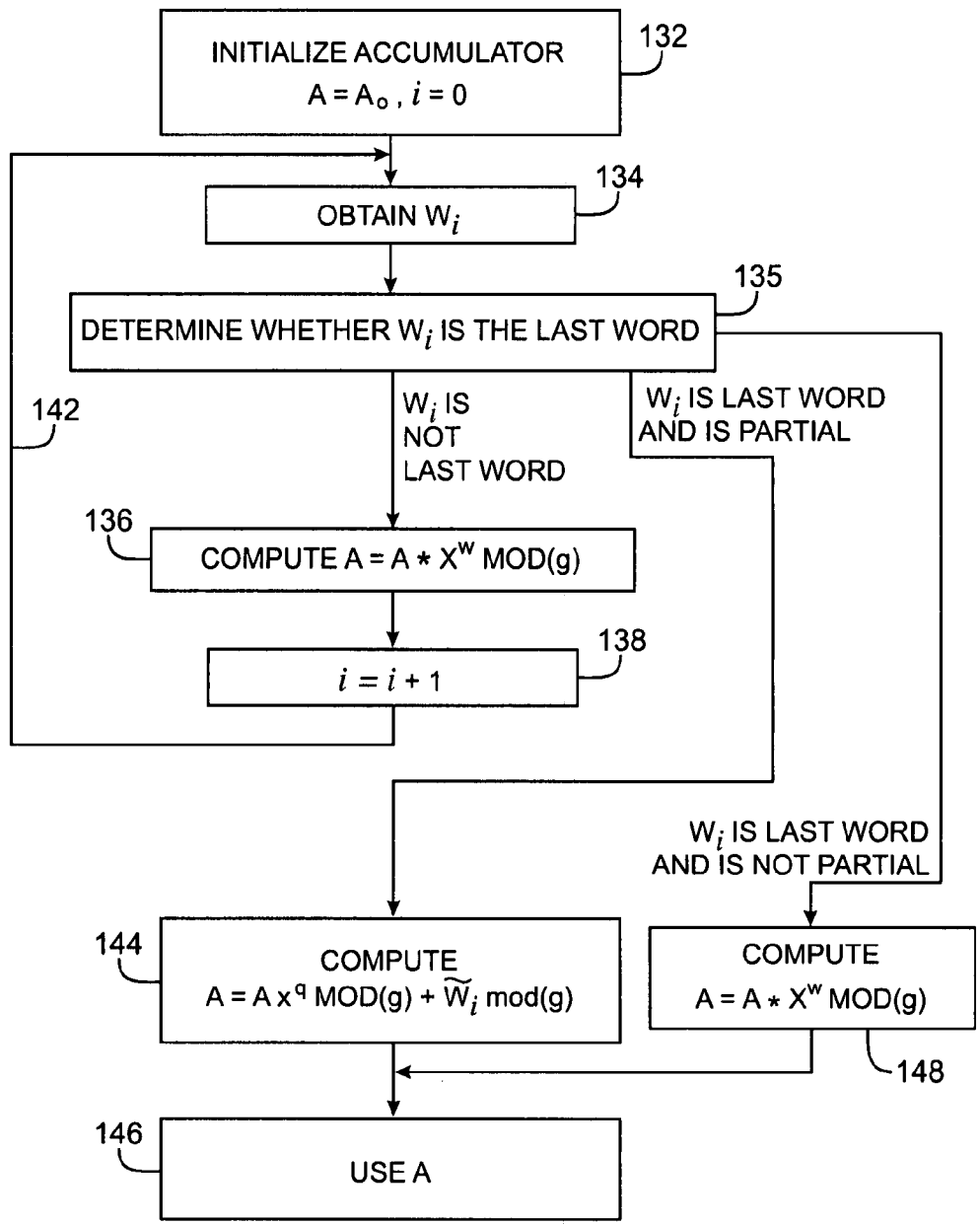
FIG. 11 is a diagram of illustrative steps involved in using cascaded conditional dividing circuits to perform CRC operations on unpadded messages in accordance with the present invention.

The number of partial CRC stages that are used in a CRC environment in which padding is not used may also be reduced using cascaded partial CRC stages, each of which has an order that is half as much as the preceding stage. Illustrative steps involved in using this type of cascaded approach to calculate a CRC accumulator are shown in FIG. 11. The operations of FIG. 11 produce a value of accumulator A that may be used at a transmitter as parity bits to append to a message to produce a codeword or that may be used at a receiver to compare to a known syndrome to detect data corruption.

At step 132, the accumulator A and counter i may be initialized.

At step 134, the word $w_i$ may be obtained from the message.

At step 135, a test may be performed to determine whether $w_i$ is the last word of the message and, if $w_i$ is the last word, whether $w_i$ is a partial word or a full word.

If $w_i$ is not the last word, at step 136, A may be updated using equation 3.

$$A=A*x^w \bmod(g) \qquad (3)$$

At step 138, the counter i may be incremented by one. The process may then loop back to step 134, as shown by line 142.

If $w_i$ is the last word, the step taken following step 135 depends on whether or not $w_i$ is a partial word or is a full word. If $w_i$ is the last word of the message and is a complete (non-partial) word, the value of the accumulator A is updated a final time using equation 3 at step 148. The accumulator calculations are then complete and the value of the accumulator may be used as the parity bits to add to the codeword (at the transmitter) or may be compared to the predetermined syndrome value (at the receiver), shown as step 146 in FIG. 11. If $w_i$ is the last word of the message and is a partial word, the accumulator A may be updated a final time using equation 4 (step 144). The accumulator may then be used at step 146.

$$A=A*x^q \bmod(g)+\hat{w}_i \bmod(g) \qquad (4)$$

In equation 4, q is the number of valid bits in the partial word and $\hat{w}_i$ is made up of the q valid bits in the partial word $w_i$.

Figure 12:
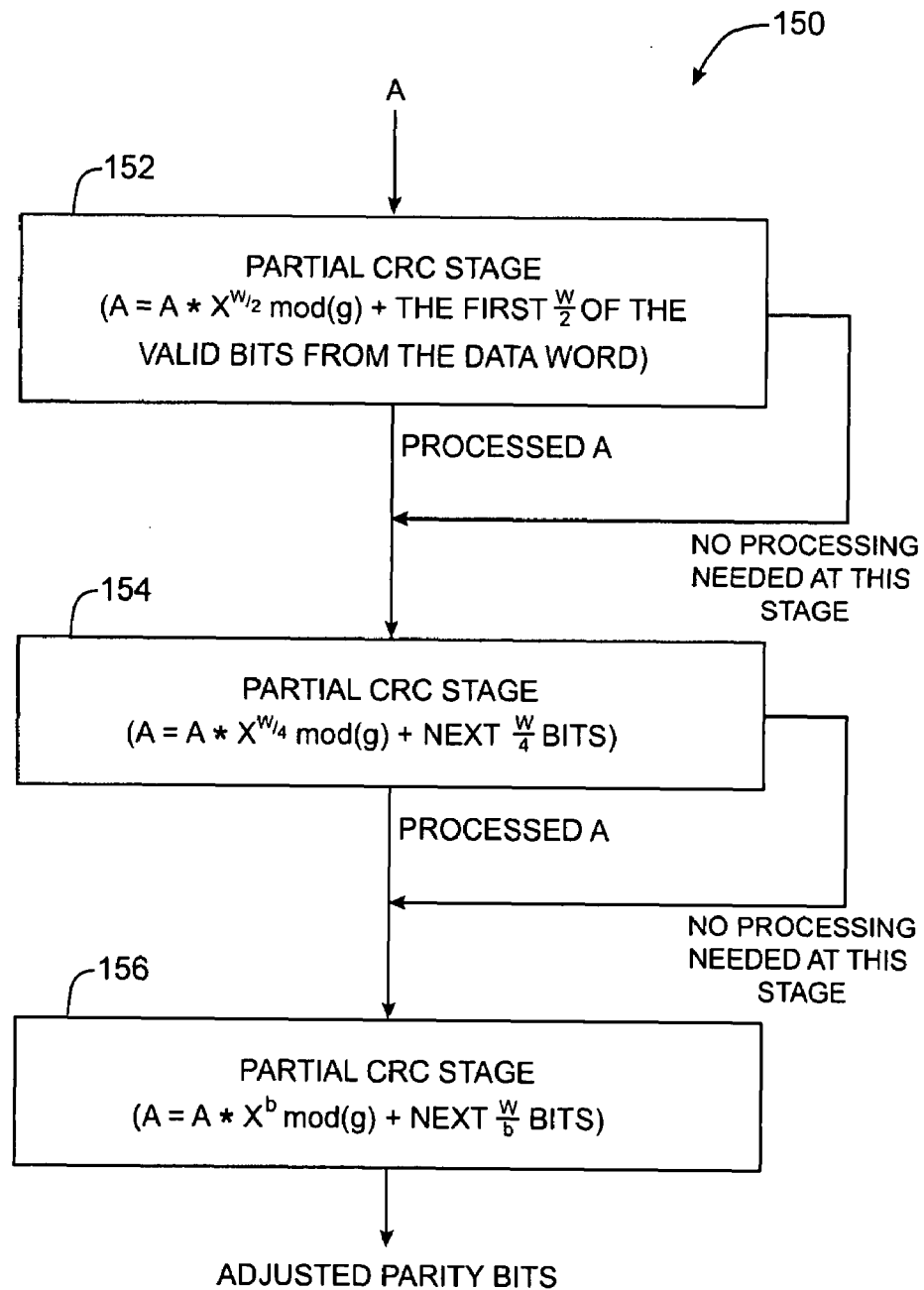
FIG. 12 is a diagram of illustrative CRC circuitry having cascaded partial CRC stages that may be used to perform CRC operations on unpadded messages in accordance with the present invention.

A cascaded series of partial CRC stages (or their software counterparts based on look-up tables) may be used in the transmitter and receiver circuitry to implement the partial-word accumulator calculations of step 144 of FIG. 11. An illustrative arrangement using cascaded partial CRC stages is shown in FIG. 12. In CRC circuitry 150 of FIG. 12, there are three partial CRC stages 152, 154, and 156. In general, the circuitry 150 may include as many stages as needed to fully process the partial word.

To reduce the amount of resources needed to implement the CRC circuitry for performing the operations of step 144 of FIG. 11, the partial CRC stages of FIG. 12 may be arranged so that each successive stage processes half as much as the previous stage. For example, the stages may be arranged so that the second stage processes half as many bytes of the partial word as the previous stage. This architecture ensures that the number of stages required in circuit 150 scales as $\log_2$ (m), where m is the number of bytes in a word, rather than scaling linearly with m. In the example of FIG. 12, three stages are used, which is sufficient to provide coverage for 8-byte words.

If desired, a single iterative CRC stage may be used to perform the functions of FIG. 12. One byte of the partial word may be processed at each pass, using the equation of box 156 in FIG. 12. Hybrid arrangements may also be used in which one or more cascaded stages of varying order such as those in FIG. 12 are used in conjunction with an iterative stage.

The foregoing is merely illustrative of the principles of this invention and various modifications can be made by those skilled in the art without departing from the scope and spirit of the invention.

What is claimed is:

1. A method for performing cyclic redundancy checking (CRC) on a message containing full words and a partial word, comprising:
    padding the partial word with pad bits to create a full word;
    computing an unadjusted value of an accumulator using the full words and the padded partial word;
    using cascaded divisions each of an order half of its predecessor to compute an adjusted value of the accumulator; and
    using the adjusted accumulator value in cyclic redundancy checking operations.

2. The method defined in claim 1 wherein each full word contains 8 bytes of message bits, the method further comprising padding the partial word until the padded partial word contains 8 bytes of message bits and pad bits.

3. The method defined in claim 1 wherein computing the adjusted accumulator value further comprises updating the accumulator value by using polynomial division to divide the accumulator value by $x^p$ mod (g), where p represents how many pad bits were used to pad the partial word and g is a generator.

4. The method defined in claim 1 wherein using the adjusted accumulator value comprises creating a codeword from the message and the adjusted accumulator value.

5. The method defined in claim 4 wherein creating the codeword comprises combining the adjusted accumulator value with the message to create the codeword.

6. The method defined in claim 4 wherein creating the codeword comprises appending an inverted version of the adjusted accumulator value to the message to create the codeword.

7. The method defined in claim 4 further comprising padding the codeword until the codeword contains only full words and no partial words.

8. The method defined in claim 7 further comprising performing CRC operations to determine whether the codeword has been corrupted using cascaded conditional polynomial division circuits.

9. The method defined in claim 8 wherein performing the CRC operations comprises using both the cascaded conditional polynomial division circuits and an iterative division circuit that performs division one byte at a time.

10. Circuitry that performs polynomial division on a cyclic redundancy check accumulator to convert an unadjusted value of the accumulator to an adjusted value of the accumulator to use in cyclic redundancy check operations, wherein a message containing full words of message bits and a partial word of message bits is padded with a number of pad bits to create a padded message, and wherein the padded message is used to calculate the unadjusted value of the accumulator, comprising:
    a plurality of cascaded conditional polynomial division circuits that each conditionally perform polynomial division on the accumulator, wherein the plurality of cascaded conditional polynomial division circuits produce the adjusted value of the accumulator by collectively dividing the unadjusted value of the accumulator by a polynomial of order equal to the number of pad bits.

11. The circuitry defined in claim 10 wherein the cascaded conditional polynomial division circuits are arranged in series, each except the first receiving the accumulator from its predecessor, wherein each of the plurality of cascaded conditional polynomial division circuits that receives the accumulator from its predecessor performs polynomial division of an order that is one half of that of its predecessor.

12. The circuitry defined in claim 10 further comprising at least one polynomial division circuit that is used iteratively to perform multiple polynomial divisions on the accumulator.

13. The circuitry defined in claim 10 wherein the plurality of cascaded conditional polynomial division circuits comprise:
    a conditional divide by $x^{32}$ circuit that receives the unadjusted value of the accumulator and supplies a corresponding output value;
    a conditional divide by $x^{16}$ circuit that receives the output value from the divide by $x^{32}$ circuit and supplies a corresponding output value; and
    a conditional divide by $x^8$ circuit that receives the output value from the divide by $x^{16}$ circuit and supplies the adjusted value of the accumulator.

14. The circuitry defined in claim 13 wherein the conditional divide by $x^{32}$ circuit, the conditional divide by $x^{16}$ circuit, and the conditional divide by $x^8$ circuit comprise inputs that receive signals indicative of the number of pad bits.

15. A method for performing cyclic redundancy checking operations on a message containing full words and a partial word, wherein the words have a word size of w, comprising:
    padding the partial word with a number of pad bits to create a full word;
    computing a value for a cyclic redundancy check accumulator by, for each word, updating a value for the accumulator using a previous version of the accumulator, wherein updating the value of the accumulator for each word comprises multiplying the previous version of the accumulator by a polynomial having an order w, wherein the multiplication is performed modulo g, where g is a generator polynomial, and by adding the multiplied previous version of the accumulator to that word, wherein the addition is performed modulo g; and
    further updating the value of the accumulator by using a plurality of cascaded conditional polynomial division circuits to divide the accumulator formed by the multiplication and addition by a polynomial of order p, where p is the number of pad bits.

16. The method defined in claim 15 further comprising inverting the further updated accumulator and appending the inverted accumulator to the message to create a codeword.

17. A method for performing cyclic redundancy checking operations on a message containing full words and a partial word, wherein the words have a word size of w, and wherein calculations are performed on a cyclic redundancy checking accumulator with polynomial multiplication and addition using a generator polynomial g, the method comprising:

initializing the cyclic redundancy checking accumulator;

for each of the full words, updating the accumulator by multiplying the accumulator's previous value by a polynomial of order w ($x^w$) mod(g); and after the full words have been processed, using a plurality of cascaded partial cyclic redundancy checking stages to process the partial word to update the accumulator to a final value, wherein using the plurality of cascaded partial cyclic redundancy checking stages comprises multiplying the accumulator's previous value by a polynomial of order q ($x^q$) mod (g) and adding $\hat{w}_i$ mod g, where q represents how many valid bits are present in the partial word and where $\hat{w}_i$ represents the q valid bits in the partial word.

18. The method defined in claim 17 further comprising using the plurality of cascaded partial cyclic redundancy check stages to perform the processing of the partial word by using each stage to process half as many bits of the partial word as its predecessor in the chain.

19. The method defined in claim 17 wherein the cascaded stages comprises first, second, and third stages, the method further comprising:

using the first stage to process 32 bits of the partial word;

using the second stage to process 16 bits of the partial word; and using the third stage to process 8 bits of the partial word.

20. The method defined in claim 17 further comprising:

constructing a codeword from the message bits and the final value of the accumulator; and transmitting the codeword from a first integrated circuit to a second integrated circuit over a communications path.

* * * * *